(12) United States Patent
Ishii et al.

(10) Patent No.: US 9,905,454 B2
(45) Date of Patent: Feb. 27, 2018

(54) SUBSTRATE TRANSFER MECHANISMS

(71) Applicant: Applied Materials, Inc., Santa Clara, CA (US)

(72) Inventors: Masato Ishii, Sunnyvale, CA (US); Mehmet Tugrul Samir, Mountain View, CA (US); Shu-Kwan Lau, Sunnyvale, CA (US); Jeffrey Tobin, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/965,228

(22) Filed: Dec. 10, 2015

(65) Prior Publication Data

US 2016/0204019 A1    Jul. 14, 2016

Related U.S. Application Data

(60) Provisional application No. 62/101,623, filed on Jan. 9, 2015.

(51) Int. Cl.
| | |
|---|---|
| *H01L 21/68* | (2006.01) |
| *H01L 21/687* | (2006.01) |
| *C23C 16/458* | (2006.01) |
| *C30B 25/12* | (2006.01) |
| *H01L 21/67* | (2006.01) |

(Continued)

(52) U.S. Cl.
CPC .... *H01L 21/68742* (2013.01); *C23C 16/4582* (2013.01); *C23C 16/4583* (2013.01); *C30B 25/12* (2013.01); *C30B 35/005* (2013.01); *H01L 21/67115* (2013.01); *H01L 21/67748* (2013.01); *H01L 21/68707* (2013.01); *H01L 21/68735* (2013.01); *H01L 21/68764* (2013.01)

(58) Field of Classification Search
CPC ......... H01L 21/67306; H01L 21/67309; H01L 21/683; H01L 21/68714; H01L 21/68742; H01L 21/68764; C23C 16/4585
See application file for complete search history.

(56) References Cited

U.S. PATENT DOCUMENTS 5,046,909 A * 9/1991 Murdoch .......... H01L 21/68707
                                                    294/113
5,382,127 A * 1/1995 Garric ................. G03F 7/70541
                                                    414/217.1

(Continued)

FOREIGN PATENT DOCUMENTS

| JP | 2001-267254 A | 9/2001 |
|---|---|---|
| JP | 2005260095 A | 9/2005 |

(Continued)

OTHER PUBLICATIONS

International Search Report for Application No. PCT/US2015/060182 dated Feb. 22, 2016; 3 pages.

*Primary Examiner* — Joseph J Hail
*Assistant Examiner* — Tyrone V Hall, Jr.
(74) *Attorney, Agent, or Firm* — Patterson + Sheridan LLP

(57) ABSTRACT

In one embodiment, a substrate support assembly includes a susceptor for supporting a substrate, and a supporting transfer mechanism coupled to the susceptor, the supporting transfer mechanism having a surface for supporting a peripheral edge of the substrate, the supporting transfer mechanism being movable relative to an upper surface of the susceptor.

13 Claims, 10 Drawing Sheets

(51) Int. Cl.
*H01L 21/677* (2006.01)
*C30B 35/00* (2006.01)

(56) References Cited

U.S. PATENT DOCUMENTS

| | | | | |
|---|---|---|---|---|
| 5,636,964 A * | 6/1997 | Somekh | ............ | H01L 21/67742 414/806 |
| 5,643,366 A * | 7/1997 | Somekh | ............ | H01L 21/67748 118/715 |
| 6,158,951 A * | 12/2000 | Carr | .................. | H01L 21/67346 414/749.4 |
| 6,217,663 B1 * | 4/2001 | Inokuchi | ............ | H01L 21/67167 118/500 |
| 6,537,011 B1 * | 3/2003 | Wang | ................ | H01L 21/68707 118/728 |
| 7,128,806 B2 * | 10/2006 | Nguyen | ................ | H01J 37/321 118/720 |
| 7,207,763 B2 * | 4/2007 | Lee | .................. | H01L 21/67303 156/345.3 |
| 7,981,217 B2 * | 7/2011 | Hagihara | .......... | H01L 21/67748 118/719 |
| 8,012,888 B2 * | 9/2011 | Ishiguro | ............ | H01L 21/67309 118/500 |
| 2003/0015141 A1 * | 1/2003 | Takagi | ................ | C23C 16/4585 118/728 |
| 2007/0089836 A1 * | 4/2007 | Metzner | ............ | H01L 21/67103 156/345.51 |
| 2008/0156260 A1 * | 7/2008 | Shive | ................ | H01L 21/67306 118/500 |
| 2010/0260589 A1 * | 10/2010 | Hwang | ............... | C23C 16/4585 414/806 |

FOREIGN PATENT DOCUMENTS

JP      2014-075467 A      4/2014
KR     2011-0029174 A      3/2011

* cited by examiner

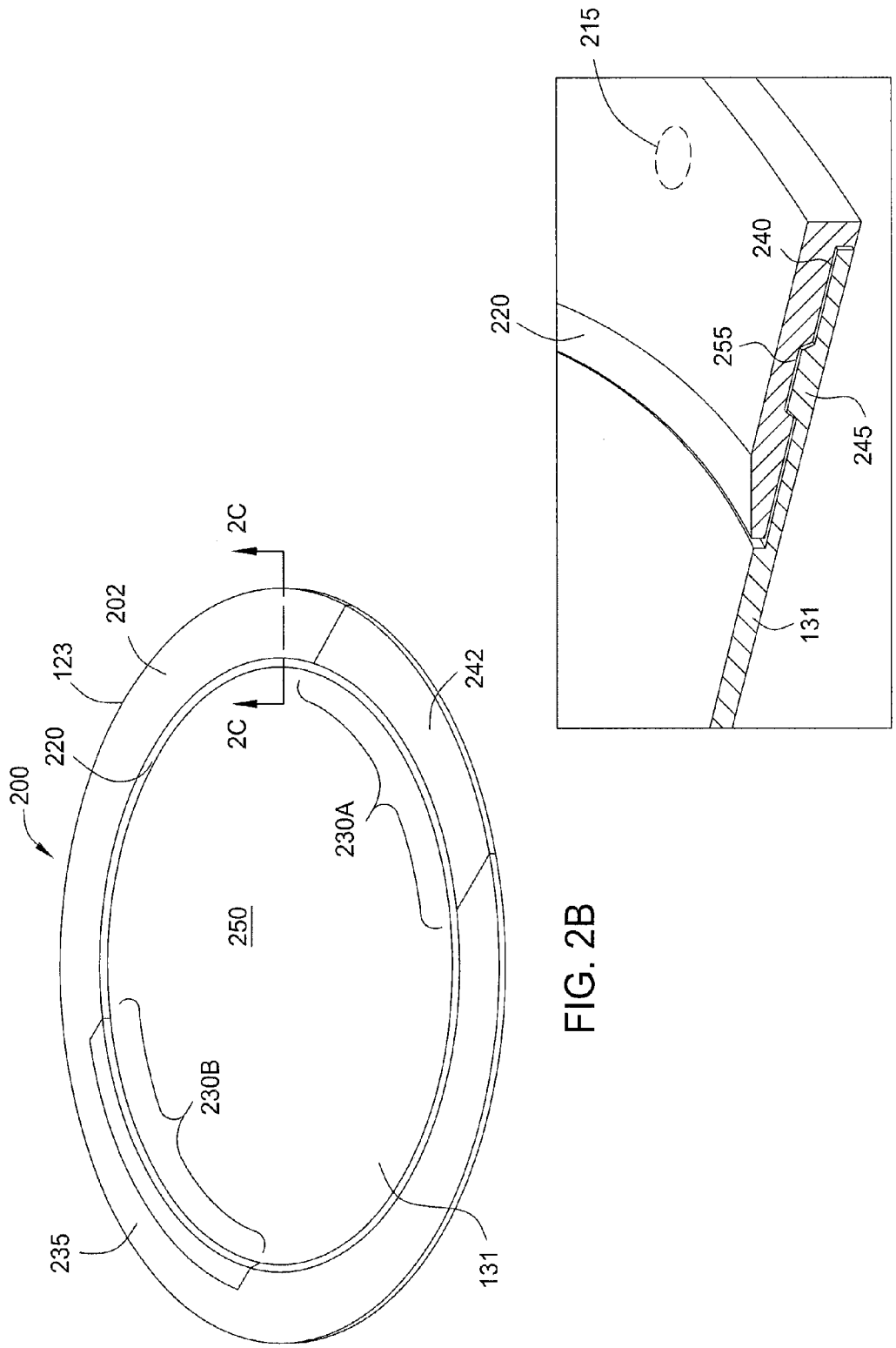

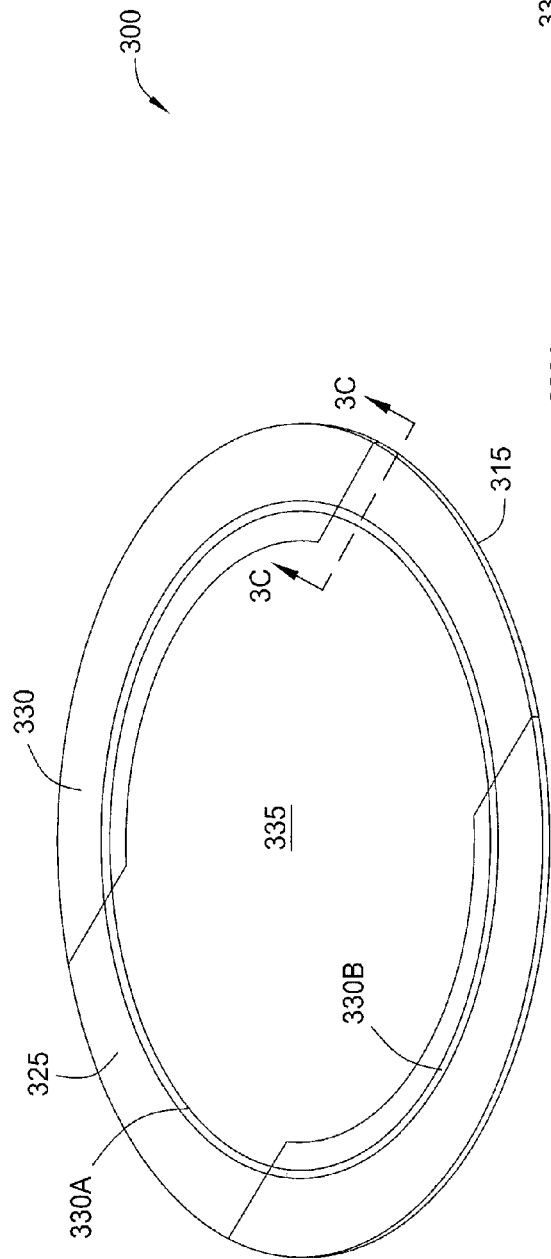
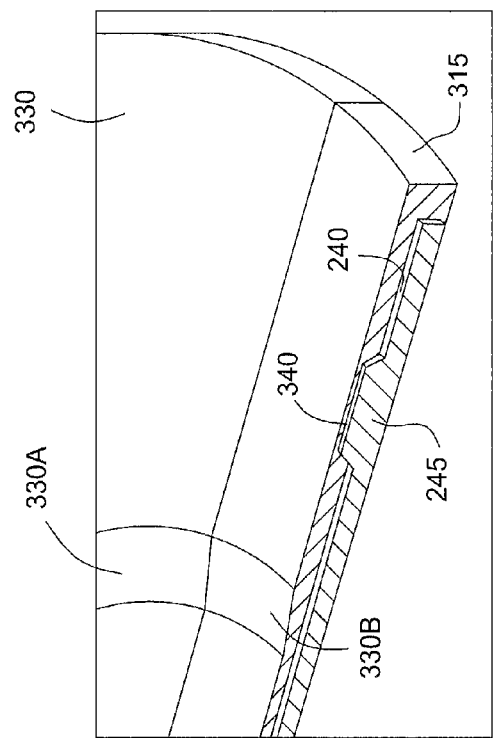
FIG. 3B
FIG. 3C

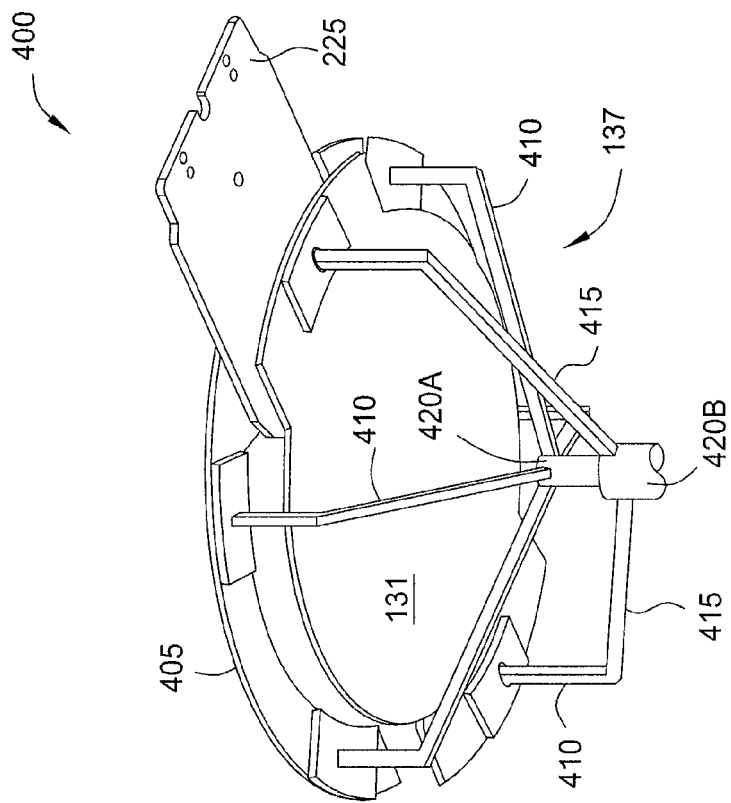
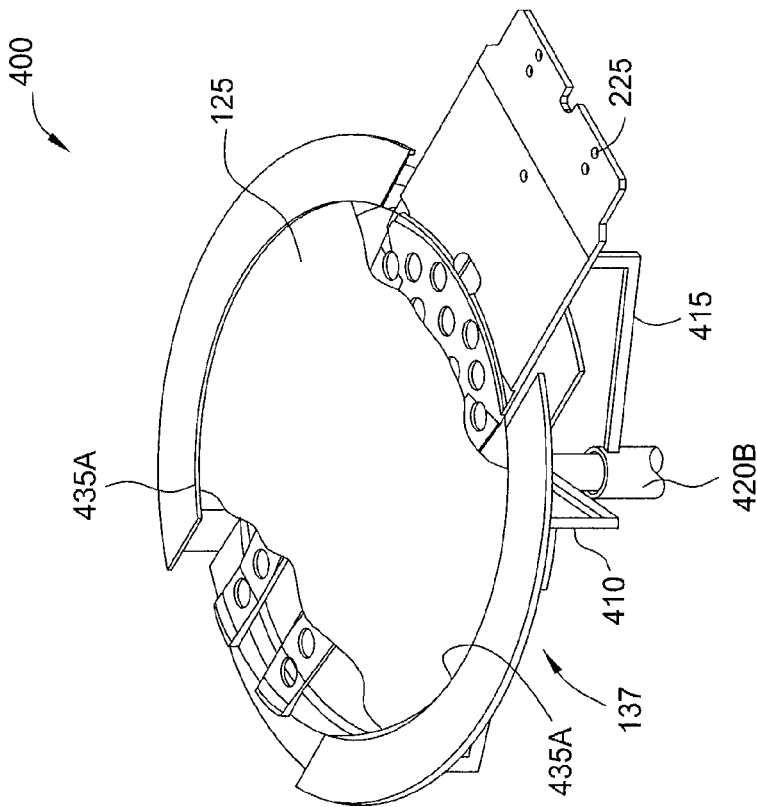
FIG. 5B
FIG. 5A

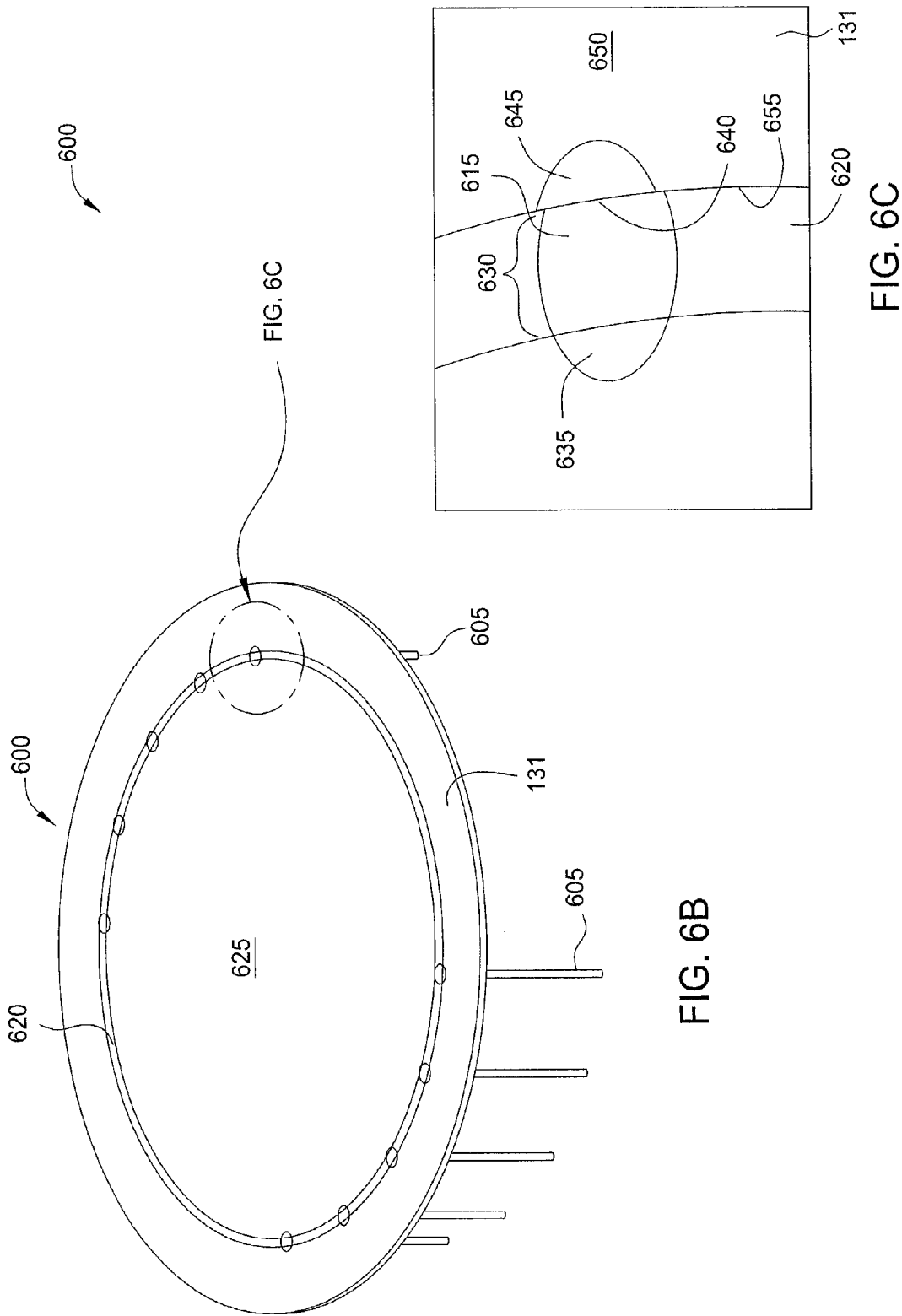

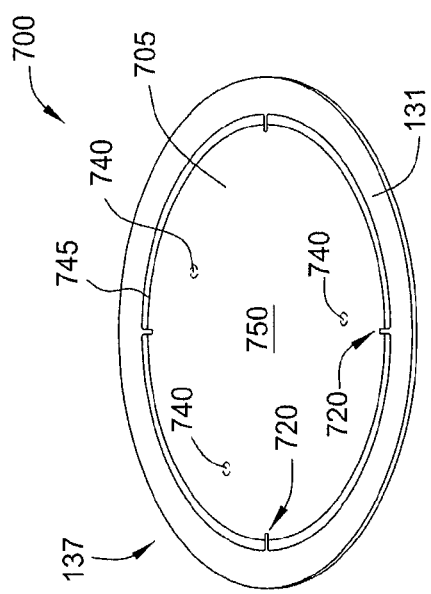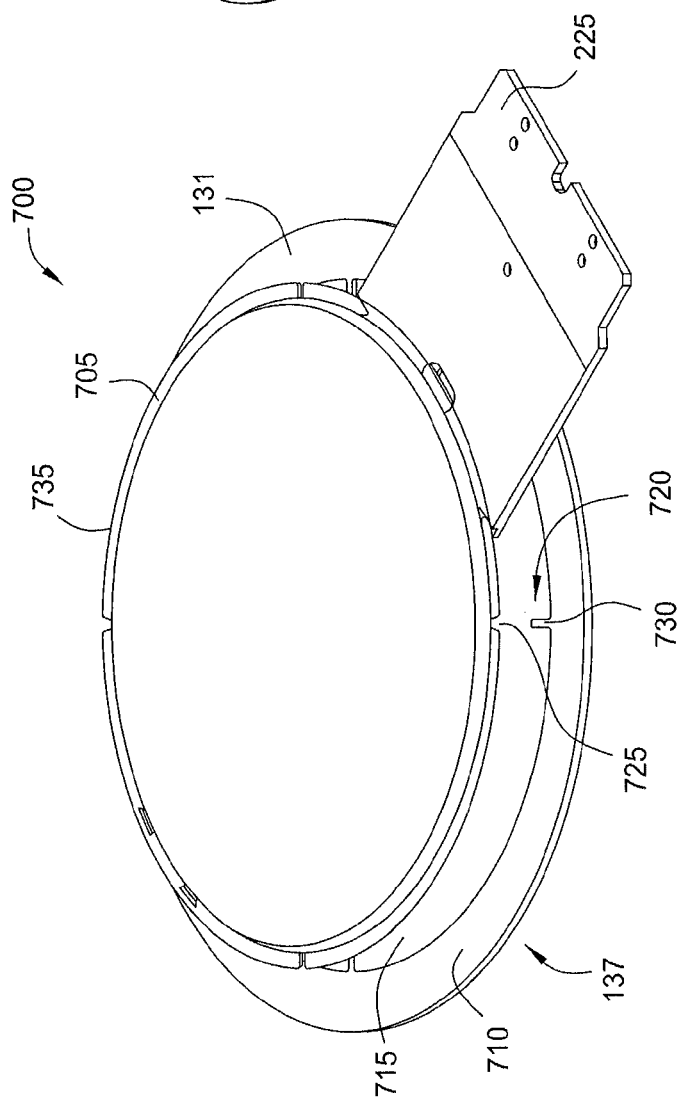

SUBSTRATE TRANSFER MECHANISMS

CROSS-REFERENCE TO RELATED APPLICATIONS

This application claims benefit of U.S. Provisional Patent Application Ser. No. 62/101,623 filed Jan. 9, 2015, which is hereby incorporated by reference herein.

BACKGROUND

Field

Embodiments disclosed herein generally relate to apparatus and methods for transferring a substrate, such as a semiconductor substrate, into or out of a processing chamber.

Description of the Related Art

In the manufacture of electronic devices on a substrate, substrates, such as a semiconductor substrate, are subjected to many thermal processes. The thermal processes are typically performed in a dedicated processing chamber where material is deposited or removed. Such processes include epitaxial deposition, chemical vapor deposition (CVD), plasma enhanced chemical vapor deposition (PECVD), etching, annealing, and the like.

The substrates are typically transferred onto lift pins disposed on a substrate support in the processing chamber by a robotic device. The lift pins typically contact the backside (non-deposit receiving side) of the substrate at discrete locations with minimal contact with the substrate. However, while the lift pins provide minimal contact with the backside of the substrate, friction is sometimes experienced between the lift pin(s) and the substrate. The friction may produce a scratch or otherwise form a mark on the backside of the substrate. Depending on the severity, the scratch or mark may affect the operability of one or more electronic devices that are being formed on the substrate. Scratching of the electronic devices results in a reduced yield of the substrate.

Thus, there is a need for an improved substrate transfer mechanism that minimizes or eliminates scratching of substrates.

SUMMARY

In one embodiment, a substrate support assembly includes a susceptor for supporting a substrate and a supporting transfer mechanism coupled to the susceptor, the supporting transfer mechanism having a surface for supporting a peripheral edge of the substrate, the supporting transfer mechanism being movable relative to an upper surface of the susceptor.

In another embodiment, a substrate support assembly includes a susceptor and a supporting transfer mechanism having a surface for supporting a substrate, the supporting transfer mechanism being movable relative to an upper surface of the susceptor and adapted to nest within a recess formed in the susceptor.

In another embodiment, a substrate support assembly includes a susceptor for supporting a substrate, the susceptor having a recessed surface and one or more indexing features extending therefrom, a supporting transfer mechanism coupled to the susceptor, the supporting transfer mechanism having a surface for supporting a peripheral edge of the substrate, the supporting transfer mechanism being movable relative to an upper surface of the susceptor, wherein the supporting transfer mechanism comprises. The supporting transfer mechanism comprises a disc-shaped body, annular portions extending from the disc-shaped body, and a pocket formed in the annular portion to receive one of the indexing features of the susceptor.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 2B is an isometric view of the substrate support assembly of FIG. 2A.

FIG. 2C is a sectional view of the ring and the susceptor along lines 2C-2C of FIG. 2B.

FIG. 3B is an isometric view of the substrate support assembly of FIG. 3A.

FIG. 3C is a sectional view of the detachable support plate and the susceptor along lines 3C-3C of FIG. 3B.

FIGS. 4A-5B are various views of another embodiment of a substrate support assembly which may be utilized in the processing chamber of FIG. 1.

FIG. 6B is an isometric view of the substrate support assembly of FIG. 6A.

FIG. 6C is an enlarged view of the susceptor and one of the lift pins of FIG. 6B.

FIGS. 7A and 7B are partial isometric views of another embodiment of a substrate support assembly which may be utilized in the processing chamber of FIG. 1.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments disclosed herein generally relate to apparatus and methods for transferring a substrate, such as a semiconductor substrate, into or out of a processing chamber. A substrate support assembly having a susceptor and a supporting transfer mechanism is disclosed which minimizes or eliminates contact between lift pins and a substrate. The reduced contact between lift pins and the substrate reduces scratches on the substrate, which minimizes particles and may improve yield.

A variety of processing chambers may be modified to incorporate the embodiments described herein. In one embodiment, atmospheric chemical vapor deposition (CVD) chambers incorporate the embodiments described herein.

Figure 1:
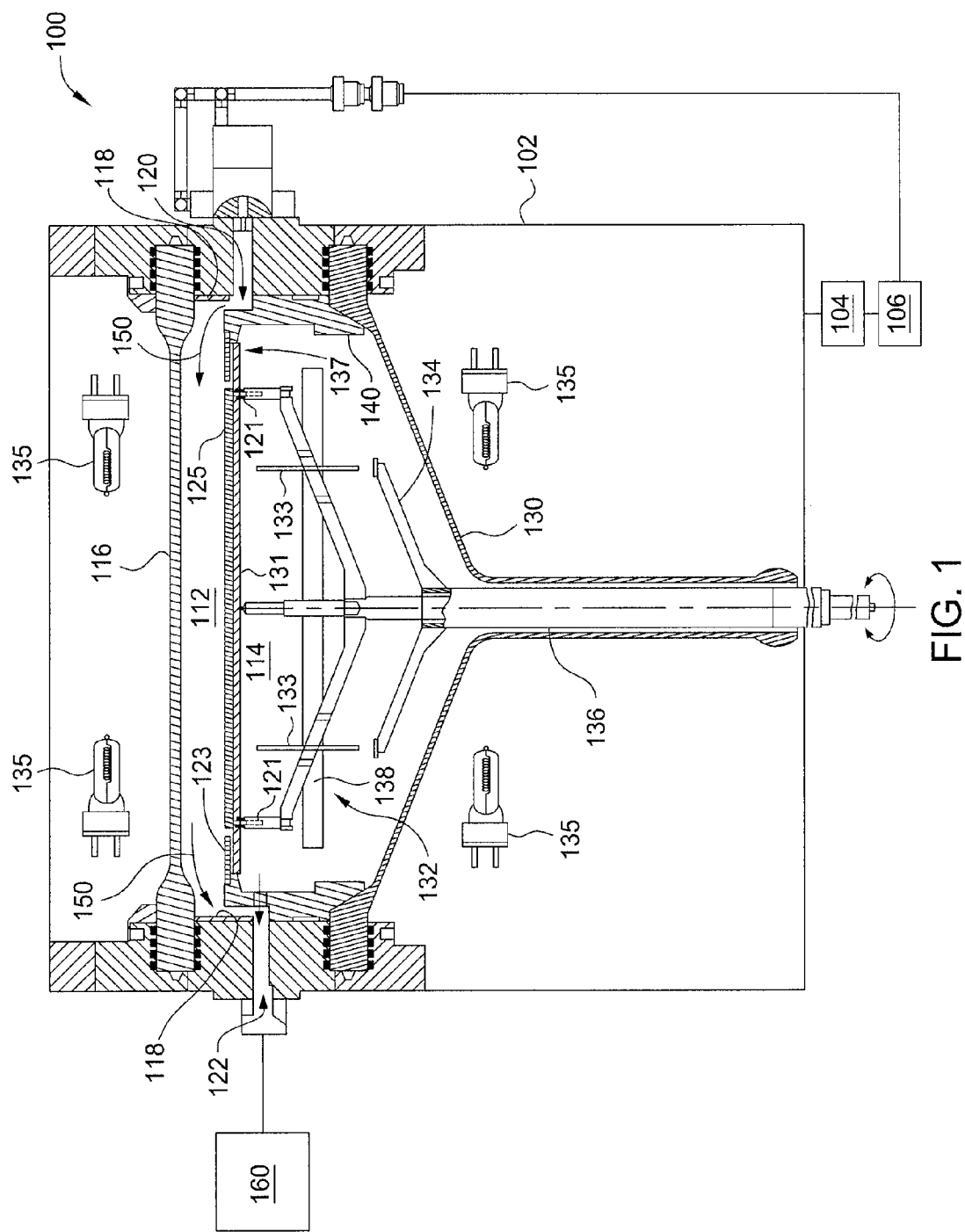
FIG. 1 is a partial cross-sectional view of a processing chamber.

One example of a CVD chamber is the epitaxial (EPI) CENTURA® system for atmospheric CVD systems, available from Applied Materials, Inc., of Santa Clara, Calif. The CENTURA® system is a fully automated semiconductor fabrication system, employing a single wafer, multi-chamber, modular design, which accommodates a wide variety of wafer sizes. In addition to the CVD chamber, the multiple chambers may include a pre-clean chamber, wafer orienter chamber, cool-down chamber, and independently operated loadlock chamber. The CVD chamber presented herein is shown in schematic in FIG. 1 is one embodiment and is not intended to be limiting of all possible embodiments. It is envisioned that other atmospheric or near atmospheric CVD chambers can be used in accordance with embodiments described herein, including chambers from other manufacturers.

FIG. 1 is a partial cross-sectional view of a processing chamber 100 according to one embodiment. The processing chamber 100 includes a chamber body 102, support systems 104, and a chamber controller 106. The chamber body 102 that includes an upper portion 112 and a lower portion 114. The upper portion 112 includes an area within the chamber body 102 between a ceiling 116 and an upper surface of a substrate 125. The lower portion 114 includes an area within the chamber body 102 between a dome 130 and a bottom of the substrate 125. Deposition processes generally occur on the upper surface of the substrate 125 within the upper portion 112.

An upper liner 118 is disposed within the upper portion 112 and is utilized to prevent undesired deposition onto chamber components. The upper liner 118 is positioned adjacent to a ring 123 within the upper portion 112. The processing chamber 100 includes a plurality of heat sources, such as lamps 135, which are adapted to provide thermal energy to components positioned within the processing chamber 100. For example, the lamps 135 may be adapted to provide thermal energy to the substrate 125 and the ring 123. The dome 130 and the ceiling 116 may be formed from an optically transparent material, such as quartz, to facilitate the passage of thermal radiation therethrough.

The chamber body 102 also includes an inlet 120 and an exhaust port 122 formed therein. The inlet 120 may be adapted to provide a process gas 150 into the upper portion 112 of the chamber body 102, while the exhaust port 122 may be adapted to exhaust the process gas 150 from the upper portion 112 into an exhaust system 160. In such a manner, the process gas 150 may flow parallel to the upper surface of the substrate 125. In one embodiment, thermal decomposition of the process gas 150 onto the substrate 125 forms an epitaxial layer on the substrate 125, facilitated by the lamps 135.

A substrate support assembly 132 is positioned in the lower portion 114 of the chamber body 102. The substrate support assembly 132 includes a susceptor 131 that is illustrated supporting the substrate 125 as well as the ring 123 in a processing position. The substrate support assembly 132 includes a plurality of support pins 121 and a plurality of lift pins 133. The lift pins 133 are vertically actuatable by support arms 134 and, in one embodiment, are adapted to contact the bottom of the susceptor 131 to lift the substrate 125 from a processing position (as shown) to a substrate transfer position. The substrate transfer position is a position where a robotic device (e.g., a robot arm or end effector) may be inserted through a sealable opening 138 and access the susceptor 131 (or other portions of the substrate support assembly 132). In other embodiments, described in subsequent Figures, the substrate support assembly 132 may provide transfer of the substrate 125 to or from a robot blade differently. Other embodiments of transferring the substrate 125 are accomplished without contact between the lift pins 133 or support pins 121 with the substrate 125. The components of the substrate support assembly 132 can be fabricated from carbon fiber, quartz, silicon carbide, graphite coated with silicon carbide or other suitable materials. The substrate support assembly 132 may include or is coupled to a shaft assembly 136 that allows movement of the support pins 121 separately from the movement of the lift pins 133. In one embodiment, the shaft assembly is adapted to rotate about a longitudinal axis thereof. In some embodiments, the substrate support assembly 132 includes a susceptor assembly 137, which includes the susceptor 131 and the ring 123 (or other supporting transfer mechanism(s) as described below), as well as portions of the support arms 134, the support pins 121 and/or the lift pins 133.

The ring 123 can be disposed adjacent a lower liner 140 that is coupled to the chamber body 102. The ring 123 can be disposed around the internal volume of the chamber body 102 and circumscribes the substrate 125 while the substrate 125 is in a processing position. The ring 123 and the susceptor 131 can be formed from a thermally-stable material such as carbon fiber, silicon carbide, quartz or graphite coated with silicon carbide. The ring 123, in combination with the susceptor 131, can separate a processing volume of the upper portion 112. The ring 123 can provide a directed gas flow through the upper portion 112 when the substrate 125 is positioned adjacent to the ring 123.

The support systems 104 include components used to execute and monitor pre-determined processes, such as the growth of epitaxial films and actuation of the substrate support assembly 132 in the processing chamber 100. In one embodiment, the support systems 104 includes one or more of gas panels, gas distribution conduits, power supplies, and process control instruments. The chamber controller 106 is coupled to the support systems 104 and is adapted to control the processing chamber 100 and the support systems 104. In one embodiment, the chamber controller 106 includes a central processing unit (CPU), a memory, and support circuits. Instructions residing in the chamber controller 106 may be executed to control the operation of the processing chamber 100. The processing chamber 100 is adapted to perform one or more film formation or deposition processes therein. For example, a silicon carbide epitaxial growth process may be performed within the processing chamber 100. It is contemplated that other processes may be performed within the processing chamber 100.

Figure 2A:
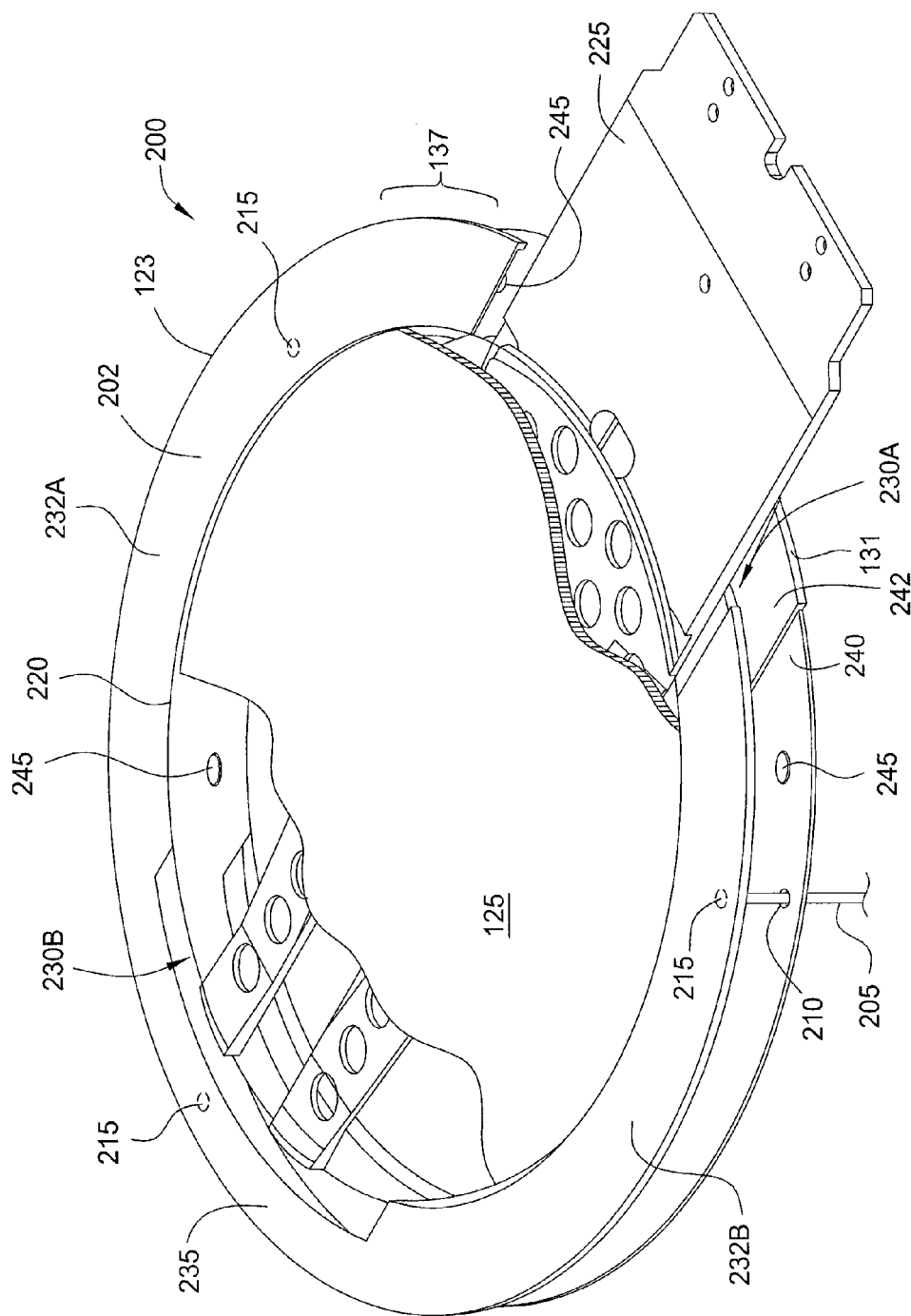
FIG. 2A is a partial isometric view of one embodiment of a substrate support assembly which may be utilized in the processing chamber of FIG. 1.

FIG. 2A is a partial isometric view of one embodiment of a substrate support assembly 200 which may be utilized as the substrate support assembly 132 in the processing chamber 100 of FIG. 1. The substrate support assembly 200 includes a susceptor assembly 137, which includes a susceptor 131 and a ring 123 as a supporting transfer mechanism. However, in this embodiment, the susceptor 131 is sized to substantially match a diameter of the ring 123. A substrate 125 is partially shown supported at an edge thereof by the ring 123. The substrate support assembly 200 also includes lift pins 205 (only one is shown in this view) which may be the support pins 121 described in FIG. 1. The substrate support assembly 200 is shown in a substrate transfer position where the ring 123 is spaced away from the susceptor 131.

The lift pins 205 extend through openings 210 (only one is shown in this view) in the susceptor 131 and contact the underside of the ring 123 at lift points 215 (shown in dashed lines) when the shaft assembly 136 (shown in FIG. 1) is actuated. The ring 123 includes an upper surface 202 and an inner edge region 220 which supports a peripheral edge of the substrate 125 during processing and transfer. The lift pins 205 are actuated to raise the ring 123 a distance from the susceptor 131 so that a robotic device 225 may be inserted between the substrate 125 and the susceptor 131, as shown in FIG. 2A. The ring 123 includes a first gap 230A and a second gap 230B that opposes the first gap 230A. Each of the first gap 230A and the second gap 230B are sized to receive a portion of the robotic device 225 and allow the robotic device 225 to be positioned under the substrate 125. In some embodiments, the first gap 230A is a through-slot that separates the ring 123 into a first segment 232A and a second segment 232B. In other embodiments, the second slot 230B may be a partial slot having a connecting portion 235 between the first segment 232A and the second segment 232B.

The susceptor 131 may also include a recessed surface 240 adjacent to a raised portion 242 where the ring 123 may be received or nest with the susceptor 131. The raised portion 242 may be sized according to the dimensions (i.e., length and/or width) of the first gap 230A and the recessed surface 240 may be recessed to a depth according to a thickness of the ring 123. In some embodiments, an upper surface of the ring 123 is coplanar with the upper surface of the raised portion 242 of the susceptor 131 when the susceptor 131 and the ring 123 are in a processing position (shown in FIG. 2B). The raised portion 242 may also include a diameter that is greater than a diameter of the recessed surface 240. The susceptor 131 may also include one or more indexing features 245 that extend from the surface of the susceptor 131 (from the recessed surface 240). The indexing features 245 may be in the shape of a truncated cone and are utilized to align the ring 123 when the ring 123 and the susceptor 131 are in proximity with each other (i.e., in the processing position).

FIG. 2B is an isometric view of the substrate support assembly 200 of FIG. 2A where the susceptor 131 and the ring 123 are in proximity to each other. The susceptor 131 may include a concave surface 250 that gradually curves inwardly (radially) from a position adjacent the inner edge region 220 of the ring 123 to a center of the susceptor 131.

FIG. 2C is a sectional view of the ring 123 and the susceptor 131 along lines 2C-2C of FIG. 2B. Shown is an indexing feature 245 extending from the recessed surface 240 of the susceptor 131. The indexing feature 245 may be received in a pocket 255 formed in the ring 123.

The embodiment shown and described in FIGS. 2A-2C prevents contact between the lift pins 205 as the substrate 125 is supported and only contacted at edges thereof by the ring 123.

Figure 3A:
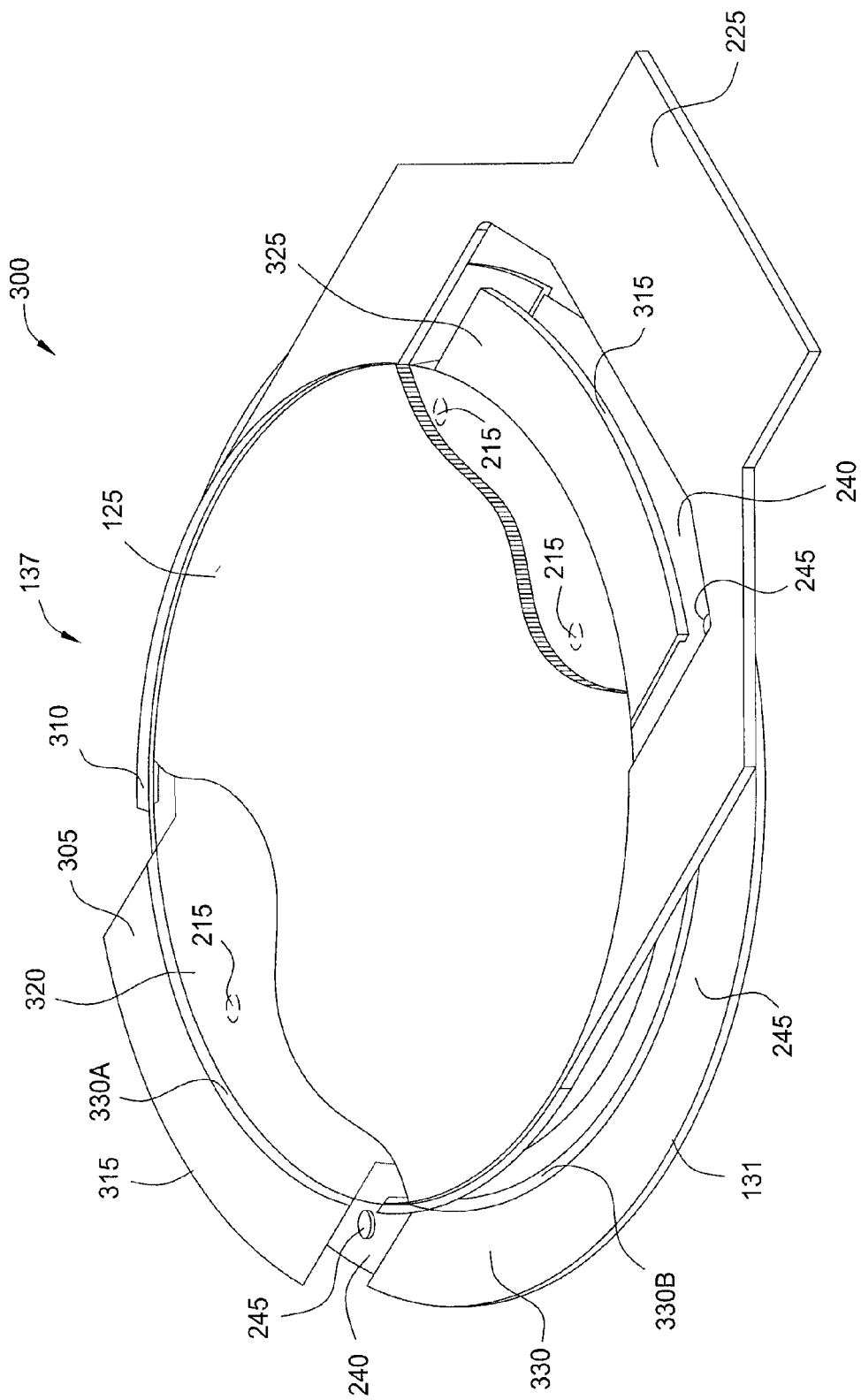
FIG. 3A is a partial isometric view of another embodiment of a substrate support assembly which may be utilized in the processing chamber of FIG. 1.

FIG. 3A is a partial isometric view of another embodiment of a substrate support assembly 300 which may be utilized as the substrate support assembly 132 in the processing chamber 100 of FIG. 1. The substrate support assembly 300 includes a susceptor assembly 137, which includes a susceptor 131 as well as a detachable support plate 305 as a supporting transfer mechanism. A substrate 125 is partially shown supported by the detachable support plate 305 where end effectors 310 of a robotic device 225 may contact an edge of the substrate 125 to facilitate transfer of the substrate 125. The detachable support plate 305 can be formed from a thermally-stable material such as carbon fiber, silicon carbide, quartz or graphite coated with silicon carbide.

In this embodiment, lift pins (which may be the lift pins 133 or the support pins 121 described in FIG. 1 (not shown in this view)) contact a backside of the detachable support plate 305 at lift points 215 (shown in dashed lines) when the shaft assembly 136 (shown in FIG. 1) is actuated. The lift pins raise or lower the detachable support plate 305 relative to the susceptor 131 which raises or lowers the substrate 125 without contact between the substrate 125 and the lift pins. In the position shown in FIG. 3A, the detachable support plate 305 may move to a position where the end effectors 310 may pass between the substrate 125 and the susceptor 131, and the substrate 125 may be picked off of the detachable support plate 305 or placed on the detachable support plate 305 based on movement of the lift pins.

The susceptor 131 according to this embodiment includes two recessed surfaces 240 where the detachable support plate 305 may be received or nest with the susceptor 131. The detachable support plate 305 includes annular portions 315 extending from a disc-shaped body 320. The recessed surfaces 240 are opposing each other and are sized to receive each annular portion 315. The susceptor 131 also includes one or more indexing features 245 that interface with the detachable support plate 305.

In the processing position (shown in FIG. 3B), an upper surface 325 of the annular portions 315 and an upper surface 330 of the susceptor 131 are coplanar. Additionally, both of the detachable support plate 305 and the susceptor 131 include an inner edge region 330A and 330B, respectively. The inner edge regions 330A and 330B which supports a peripheral edge of the substrate 125 during processing.

FIG. 3B is an isometric view of the substrate support assembly 300 of FIG. 3A where the susceptor 131 and the detachable support plate 305 are in proximity to each other. The detachable support plate 305 may include a concave surface 335 that gradually curves inwardly (radially) from a position adjacent the inner edge region 330A and 330B of the detachable support plate 305 to a center of the detachable support plate 305.

FIG. 3C is a sectional view of the detachable support plate 305 and the susceptor 131 along lines 3C-3C of FIG. 3B. Shown is an indexing feature 245 extending from the recessed surface 240 of the susceptor 131. The indexing feature 245 may be received in a pocket 340 formed in the susceptor 131.

The embodiment shown and described in FIGS. 3A-3C may prevent contact between lift pins as the substrate 125 is supported and may be only contacted at edges thereof by the detachable support plate 305 during transfer.

Figure 4B:
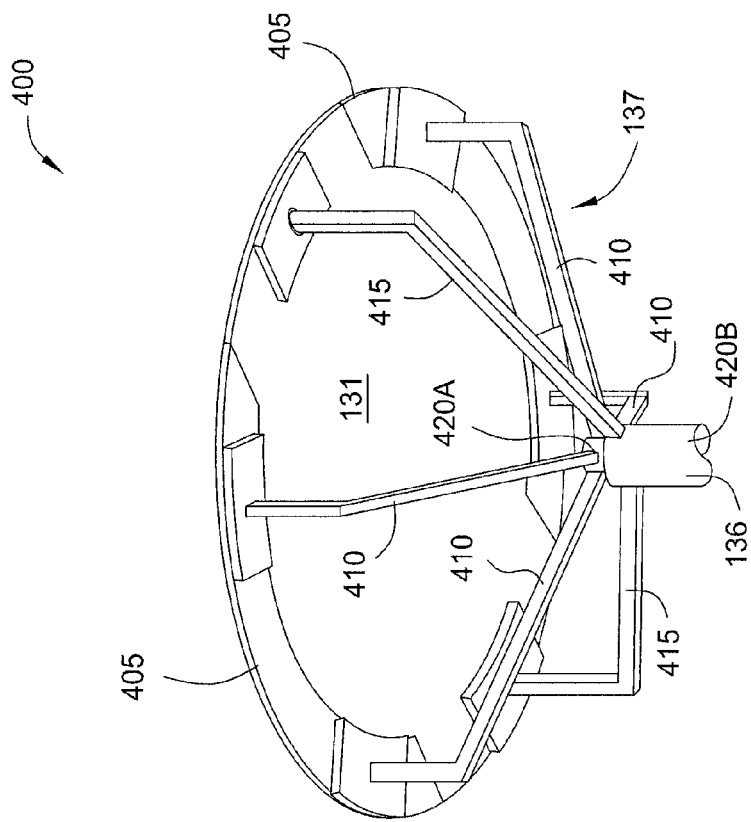
Figure 4A:
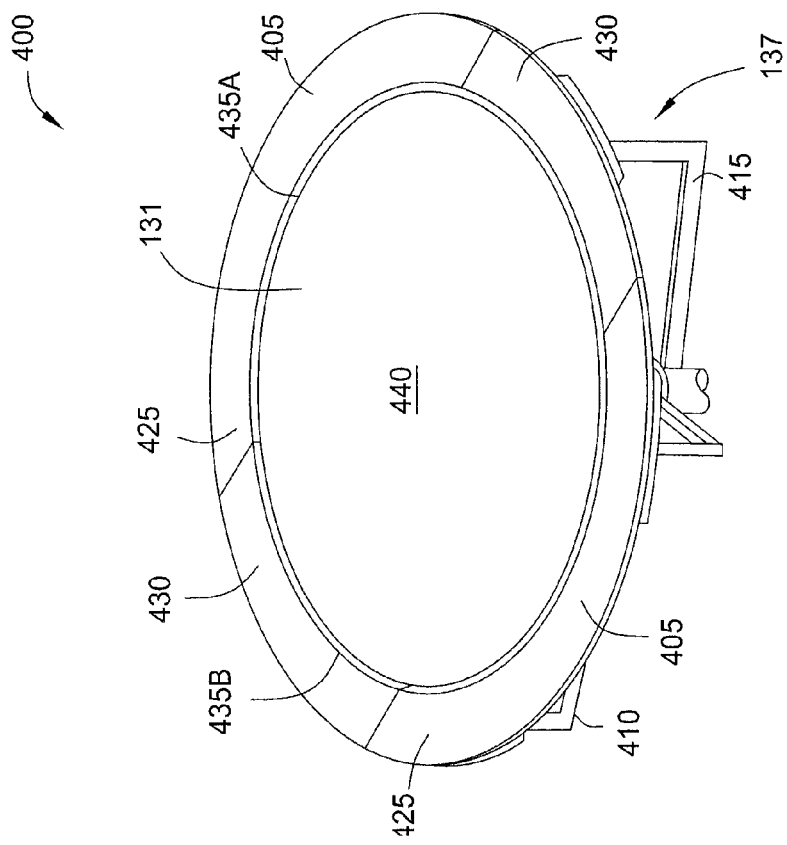

FIGS. 4A-5B are various views of another embodiment of a substrate support assembly 400 which may be utilized as the substrate support assembly 132 in the processing chamber 100 of FIG. 1. FIG. 4A is an isometric top view the substrate support assembly 400 and FIG. 4B is an isometric bottom view of the substrate support assembly 400 of FIG. 4A. The substrate support assembly 400 includes a susceptor assembly 137, which includes a susceptor 131 and dual ring segments 405 that are selectively detachable from the susceptor 131. The ring segments 405 are a supporting transfer mechanism in this embodiment. The position of the substrate support assembly 400 in FIGS. 4A and 4B is a processing position and a transfer position is shown in FIGS. 5A and 5B. A substrate is not shown in order to more clearly show the substrate support assembly 400.

The susceptor assembly 137 also includes a plurality of first support arms 410 coupled to a first shaft 420A of the shaft assembly 136. Each of the plurality of first arms 410 are coupled to the ring segments 405. The susceptor assembly 137 also includes a plurality of second support arms 415 coupled to a second shaft 420B of the shaft assembly 136. The second support arms 415 are coupled to the susceptor 131. At least one of the first shaft 420A and the second shaft 420B are capable of movement independent of the other.

In the processing position, an upper surface 425 of the ring segments 405 and an upper surface 430 of the susceptor 131 are coplanar. Additionally, both of the ring segments 405 and the susceptor 131 include an inner edge region 435A and 435B, respectively. The inner edge regions 435A and 435B supports a peripheral edge of the substrate 125 during processing and transfer processes.

In some embodiments, the susceptor 131 may include a concave surface 440 that gradually curves inwardly (radially) from a position adjacent the inner edge region 435A and 435B of the ring segments 405 and the susceptor 131, respectively, to a center of the susceptor 131.

FIGS. 5A and 5B illustrate the substrate support assembly 400 of FIGS. 4A and 4B in a transfer position. FIG. 5A is an isometric top view the substrate support assembly 400 and FIG. 5B is an isometric bottom view of the substrate support assembly 400 of FIG. 5A. A substrate 125 is partially shown in FIG. 5A supported by the ring segments 405.

In one example of operation, the first shaft 420A may move in the Z direction while the second shaft 420B is stationary, which causes the ring segments 405 to be spaced away from the plane of the susceptor 131. In another example of operation, the second shaft 420B may move in the Z direction while the first shaft 420A is stationary, which causes the susceptor 131 to be spaced away from the plane of the ring segments 405. In other examples, both of the first shaft 420A and the second shaft 420B may move in opposite directions along the Z direction to space the ring segments 405 from the susceptor 131. In any case, the substrate 125, supported on a periphery thereof by the inner edge regions 435A of the ring segments 405, is lifted away from the susceptor 131. The ring segments 405 may be spaced away from the susceptor 131 such that a robotic device 225 may pass between a lower surface of the substrate 125 and an upper surface of the susceptor 131. The substrate 125 may be picked off of the ring segments 405 or placed on the ring segments 405 based on movement of one or both of the first shaft 420A and second shaft 420B, which effects relative movement of the ring segments 405 and the susceptor 131.

Figure 6A:
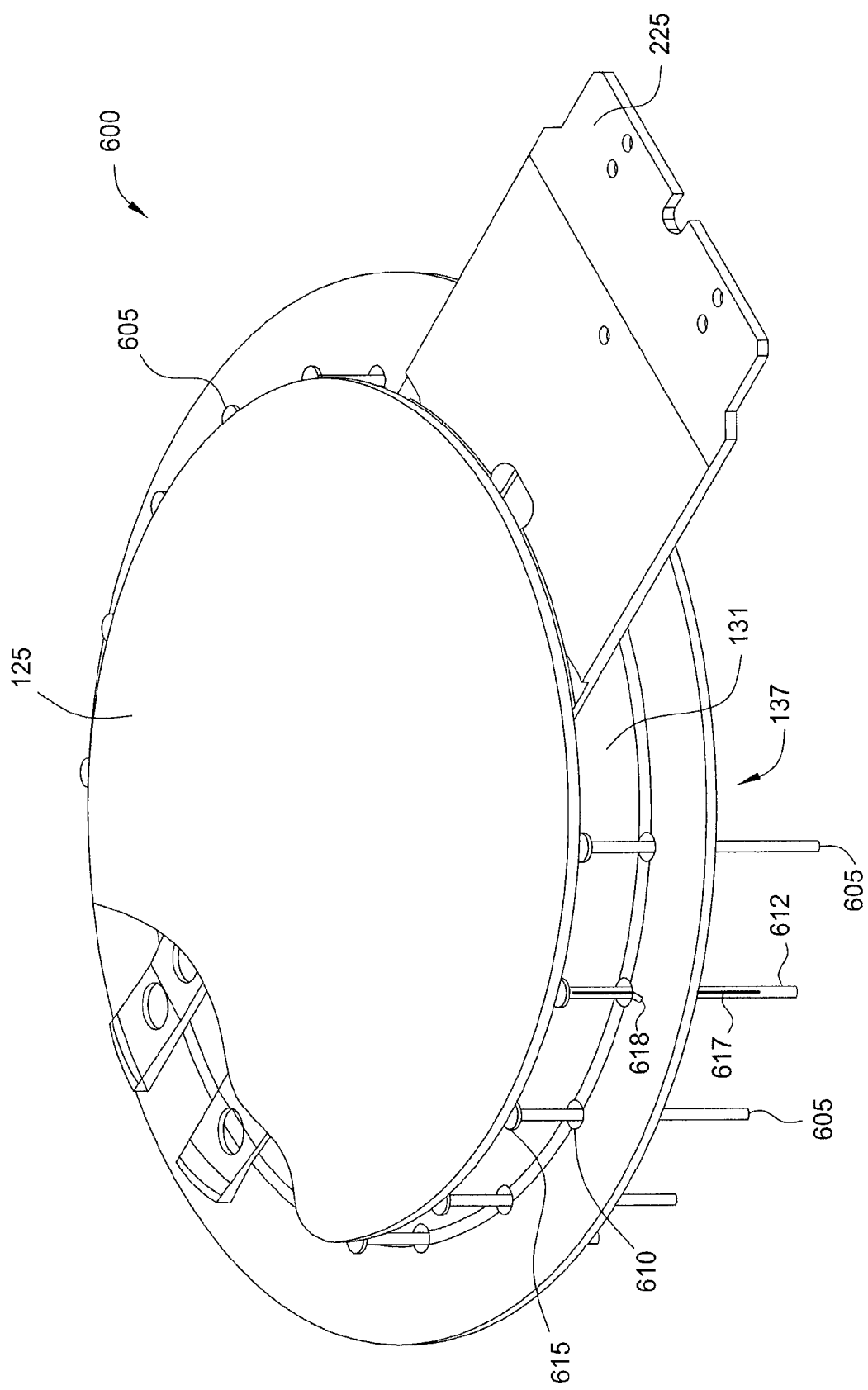
FIG. 6A is a partial isometric view of one embodiment of a substrate support assembly which may be utilized in the processing chamber of FIG. 1.

FIG. 6A is a partial isometric view of one embodiment of a substrate support assembly 600 which may be utilized as the substrate support assembly 132 in the processing chamber 100 of FIG. 1. The substrate support assembly 600 includes a susceptor assembly 137, which includes a susceptor 131 and a plurality of lift pins 605 as a supporting transfer mechanism. Each of the lift pins 605 are disposed in openings 610 formed in the susceptor 131. Each of the lift pins 605 may include a flared head 615 that facilitates supporting a peripheral edge of a substrate 125 during processing and transfer processes. The flared head 615 is also sized greater than a diameter of the openings 610 such that the flared head 615 retains the lift pins 605 in the openings 610. Thus, when the substrate support assembly 600 is in a processing position (shown in FIG. 6B), the lift pins 605 may be suspended by the susceptor 131. In one embodiment, the lift pins 605 are free-floating as shown and described but in other embodiments, the lift pins 605 may be coupled to lift arms, such as the support pins 121 or the lift pins 133 shown in FIG. 1. The lift pins 605 include a shaft 612 that is moveably disposed in the openings 610. In some embodiments, the shaft 612 includes an indexing feature 617, which may be a slot or key, or a polygonal shape, that prevents rotation of the lift pins 605 about a longitudinal axis thereof. The openings 610 of the susceptor 131 may include a slot 618 that interfaces with the indexing feature 617.

FIG. 6B is an isometric view of the substrate support assembly 600 of FIG. 6A showing the susceptor 131 and the lift pins 605 in a processing position. The susceptor 131 may include an inner edge region 620 that supports a peripheral edge of a substrate (not shown) during processing. The susceptor 131 may include a concave surface 625 that gradually curves inwardly (radially) from a position adjacent the inner edge region 620 of the susceptor 131 to a center of the susceptor 131.

FIG. 6C is an enlarged view of the susceptor 131 and one of the lift pins 605 of FIG. 6B. In one embodiment, the flared head 615 of the lift pin 605 may include a first sloped surface 630 that matches a slope or contour of the inner edge region 620 of the susceptor 131. In some embodiments, the flared head 615 of the lift pin 605 may include a second sloped surface 635 that matches a contour of the concave surface 625 of the susceptor 131. However, in other embodiments, the flared head 615 of the lift pins 605 is flat or planar. In some embodiments, the flared head 615 of the lift pin 605 includes a step or shoulder 640 that transitions from an upper surface 645 of the flared head 615 to the first sloped surface 630. The upper surface 645 may be coplanar with an upper surface 650 of the susceptor 131. The upper surface 650 may be planar. In some embodiments, the susceptor 131 also includes a step or shoulder 655 that matches the shoulder 640.

FIGS. 7A and 7B are partial isometric views of another embodiment of a substrate support assembly 700 which may be utilized as the substrate support assembly 132 in the processing chamber 100 of FIG. 1. The substrate support assembly 700 includes a susceptor assembly 137, which includes a susceptor 131 as well as a detachable support plate 705 as a supporting transfer mechanism. The substrate support assembly 700 is shown in FIG. 7A in a transfer position while the substrate support assembly 700 shown in FIG. 7B is in a processing position.

In this embodiment, the susceptor 131 includes a peripheral edge 710 and a recessed portion 715 circumscribed by the peripheral edge 710. The recessed portion 715 may be sized to receive the detachable support plate 705 such that the detachable support plate 705 nests with the susceptor 131 in a processing position. The substrate support assembly 700 also includes one or more indexing features 720 to facilitate alignment of the detachable support plate 705 with the susceptor 131. The indexing features 720 include a slot 725 formed in the detachable support plate 705 and a shoulder 730 formed on the susceptor 131. The shoulder 730 may extend radially inward from the peripheral edge 710 of the susceptor 131 and the slot 725 extends radially inward from an outer edge 735 of the detachable support plate 705. As shown in FIG. 7B, the indexing features 720 facilitate alignment of the detachable support plate 705 with the susceptor 131 in the processing position. A substrate is not shown in FIG. 7B in order to show more details of the substrate support assembly 700.

The detachable support plate 705 is spaced apart from the susceptor 131 using lift pins (not shown) that contact a backside of the detachable support plate 705 at lift points 740. The lift pins may be the lift pins 133 shown in FIG. 1 and may be disposed through openings (not shown) in the susceptor 131 to contact the backside of the detachable support plate 705. As shown in FIG. 7A, the detachable support plate 705, with the substrate 125 thereon, may be spaced away from the susceptor 131 to a position where a robotic device 225 may pass between a lower surface of the detachable support plate 705 and an upper surface of the susceptor 131. The substrate 125 and the detachable support plate 705 may then be transferred onto or off of the lift pins.

The detachable support plate 705 may be used as a substrate carrier that transports a substrate 125 through a substrate processing tool or processing system. For example, the detachable support plate 705 may transfer the substrate 125 from a loadlock chamber (not shown) into and out of processing chambers, such as the processing chamber 100 shown in FIG. 1, and back into a loadlock chamber. The detachable support plate 705 may be shaped to provide transfer of the substrate 125 between a front opening universal pod (FOUP (not shown)) and the detachable support plate 705. For example, a robotic device for transfer of a substrate between the detachable support plate 705 and the FOUP may contact an edge of the substrate. In this instance, the detachable support plate 705 may include cut-out regions on or near the outer edge 735 of the detachable support plate 705. In one example, the slots 725 may be used for this purpose. The detachable support plate 705 can be formed from a thermally-stable material such as carbon fiber, silicon carbide, quartz or graphite coated with silicon carbide.

The detachable support plate 705 may include an inner edge region 745 that supports a peripheral edge of the substrate 125 during processing. The detachable support plate 705 may include a concave surface 750 that gradually curves inwardly (radially) from a position adjacent the inner edge region 745 of the detachable support plate 705 to a center of the detachable support plate 705.

While the foregoing is directed to embodiments of the present disclosure, other and further embodiments of the disclosure may be devised without departing from the basic scope thereof, and the scope thereof is determined by the claims that follow.

The invention claimed is:

1. A substrate support assembly comprising:
   a susceptor for supporting a substrate, the susceptor having a recessed surface with one or more ridges; and
   a supporting transfer mechanism coupled to the susceptor, the supporting transfer mechanism having a surface for supporting a peripheral edge of the substrate, the supporting transfer mechanism being movable relative to an upper surface of the susceptor, wherein the supporting transfer mechanism comprises:
   a disc-shaped body;
   annular portions extending from a perimeter of the disc-shaped body; and
   a pocket formed in the annular portion to receive one of the one or more ridges of the recessed surface.

2. The substrate support assembly of claim 1, wherein the supporting transfer mechanism comprises a ring.

3. The substrate support assembly of claim 2, wherein the ring has a first gap.

4. The substrate support assembly of claim 3, wherein the ring has a second gap opposing the first gap.

5. The substrate support assembly of claim 3, wherein the susceptor comprises a recessed portion sized to receive the ring.

6. The substrate support assembly of claim 1, wherein the supporting transfer mechanism comprises a plurality of ring segments.

7. The substrate support assembly of claim 6, wherein the susceptor comprises a recessed portion sized to receive the ring segments.

8. The substrate support assembly of claim 1, further comprising:
   a plurality of lift pins for supporting the susceptor.

9. The substrate support assembly of claim 8, further comprising:
   a plurality of support pins positioned radially outward of the plurality of lift pins.

10. The substrate support assembly of claim 9, wherein each of the plurality of lift pins are independently movable relative to the plurality of support pins.

11. The substrate support assembly of claim 9, wherein each of the support pins comprises a flared head disposed on a shaft.

12. The substrate support assembly of claim 11, wherein the flared head comprises a sloped surface.

13. The substrate support assembly of claim 1, wherein the disc-shaped body comprises a detachable support plate.

* * * * *